(12) United States Patent
Soo et al.

(10) Patent No.: US 8,694,944 B1
(45) Date of Patent: Apr. 8, 2014

(54) PREDICTING ROUTABILITY OF INTEGRATED CIRCUITS

(75) Inventors: Sze Huey Soo, Gurun (MY); Thow Pang Chong, Sungai Ara (MY); Boon Jin Ang, Bagan Ajam Butterworth (MY); Kar Keng Chua, Juru (MY)

(73) Assignee: Altera Corporation, San Jose, CA (US)

( * ) Notice: Subject to any disclaimer, the term of this patent is extended or adjusted under 35 U.S.C. 154(b) by 172 days.

(21) Appl. No.: 12/643,528

(22) Filed: Dec. 21, 2009

(51) Int. Cl.
*G06F 17/50* (2006.01)

(52) U.S. Cl.
USPC ............ 716/126; 716/103; 716/110; 716/118

(58) Field of Classification Search
USPC ................................................ 716/103, 126
See application file for complete search history.

(56) References Cited

U.S. PATENT DOCUMENTS

| 5,784,289 A * | 7/1998 | Wang ........................... 716/122 |
| 7,401,313 B2 * | 7/2008 | Galatenko et al. ............ 716/104 |

* cited by examiner

*Primary Examiner* — Vuthe Siek
*Assistant Examiner* — Eric Lee
(74) *Attorney, Agent, or Firm* — Mauriel Kapouytian Woods LLP; Michael Mauriel

(57) ABSTRACT

Methods, computer program products, and systems are disclosed associated with calculating a routability metric for a second IC design using inputs from the compilation to a first IC design. The first and second IC designs are alternative implementation options for a user circuit design, such as FPGA and structured ASIC options. Information about user design demands on routing resources of one IC design are considered along with information about the projected supply of routing resources in another IC design, to produce a routing metric. The routing metric may be mapped to a degree of difficulty indicator, and either may be used to condition a compile of the user circuit to the second IC design or be used in other ways.

23 Claims, 6 Drawing Sheets

PREDICTING ROUTABILITY OF INTEGRATED CIRCUITS

BACKGROUND

Generally, IC devices have different layers to define the component layout and wire connections between the components in the device. In the manufacture of IC devices, circuit components (such as transistors, capacitors, and diodes) are placed on layers that are separate from the layers that contain the wire connections. Routing is the process of adding wires to connect all the placed circuit components under certain design constraints. The layers where routing takes place are typically known as routing layers.

The routing information in an IC design has great impact on interconnect length, and thus the power consumption of the device. In portions of many designs, the routing demand can be close to the available resources; these regions are deemed congested or blocked. In the design flow of an IC device, routing is performed during compilation in a step called place-and-route.

The layers in an IC device are formed using masks that have been either pre-engineered or custom-designed. The customization of masks typically requires long design cycles and substantial non-recurrent engineering (NRE) costs. Some IC devices such as custom application-specific integrated circuits (ASICS) and semi-custom ASICs are designed using customized masks. At the other end of the spectrum, some IC devices such as field-programmable gate arrays FPGAs are designed without customized masks. For certain purposes, it is sometimes desirable to build a maskless device prototype and convert the prototype to a device for mass production when the design is finalized. The converted design will perform the same functionalities as the design it was converted from; in other words, both designs are functionally equivalent. Such a conversion greatly reduces NRE and mask costs, and shortens the development cycle. An example of such a conversion involves converting the design of an FPGA prototype to the design of a structured ASIC device.

The conversion of a first IC design to a functionally equivalent second IC design typically involves performing separate compilations on both designs. However, the quest for ever shorter development cycles has led some electronic design automation (EDA) software to provide early information required for a user to predict whether the compilation of the second IC design will be successful. Current EDA software provides early identification on the usage of resources such as logic usage, memory requirements, and I/O specification. Resource usage information is a good indication of how feasible it is to convert a first IC design to a second IC design. However, the early resource usage information provided by current EDA software does not give an accurate indication of the routability of the second IC design after it has been converted from a first IC design. Conversions that are predicted to be successful might encounter routing problems during the actual compilation of the second IC design due to the different routing architecture for both IC devices. Therefore, it is pertinent that early information on the routability of a design is made available for a user to accurately predict the outcome of the conversion.

SUMMARY

Embodiments of the inventive subject matter provide methods, computer program products, and systems related to predicting the routability of a second target IC design after compiling a user circuit design to a first target IC design. The result is a reliable prediction of the routability of an IC design without having to compile the design and thus, leading to a shorter overall development time. In many embodiments, the prediction of routability is represented in a routability metric. In one preferred embodiment, the routability metric is a single numeric value.

It should be appreciated that the inventive subject matter can be implemented in numerous ways, such as a process, an apparatus, a system, a device, or a method on a computer-readable medium. Several inventive embodiments are described below.

In one embodiment, a user circuit design is compiled using EDA computing apparatus targeting a first IC design. The compilation to the first IC design produces results in computer readable storage, certain of which are then used as inputs to calculate the routability metric of a second IC design. The inputs used in this embodiment to calculate the routability metric include the average interconnects value of the first IC design. In addition to that, the available routing area and total routing blockage of the second IC design are also taken into consideration.

In one embodiment, the routability metric of a second IC design that has been calculated after compiling a first IC design is mapped to a degree of routing difficulty. The degree of routing difficulty is used as an indicator on whether to compile the second IC design. To ascertain the degree of routing difficulty for a second IC design, the spectrum of values for the routability metric is divided into several ranges of values. Each range of values is assigned a certain degree of difficulty that represents the amount of time and computing resources that needs to be expended to route the second IC design. After compilation targeting the first IC design, routability metric is calculated for the second IC design. If the calculated routability metric falls within a certain range, it is given a degree of difficulty associated with the range. A user can then use the degree of difficulty to decide whether to proceed with the compilation of the second IC design or not. The routability metric can also be used by an EDA computing device to automatically compile the second IC design without involving any human intervention.

In one embodiment, the routability metric of a second IC design is calculated by determining a relationship between certain routing demands imposed on the first IC design by the user circuit design and routing supply of a routing layer in the second IC design. The routing demand of a routing layer in the second IC design represents an average amount of interconnects that are required in the routing layer. The routing demand is obtained from the compilation targeting the first IC design. The routing supply represents the area that is available for routing in one or more corresponding routing layers of the second IC design.

In one embodiment, the routing demand or amount of average interconnects that are available for routing in the second IC design is determined by first calculating the amount of average interconnects associated with the first IC design. The amount of interconnects in the first IC design is obtained from the compilation targeting the first IC design. Then, based on a track metric, the amount of average interconnects for the first IC design is scaled to the amount of average interconnects for the second IC design. A track metric represents the length of routing tracks available in a routing layer of the first IC design compared to the length of routing tracks available in one or more corresponding routing layers of the second IC design.

In one embodiment, the routing supply or available routing area in the second IC design represents the routing area that can be used without any routing blockage. To determine the routing supply, the core blockage of each particular type of core block in a routing layer of the second IC design is first calculated. Then the total blockage caused by all core block instances in the routing layer is calculated and excluded from the total routing area in the second IC design.

Other aspects and advantages of the embodiments of the inventive subject matter will become apparent from the following detailed description, taken in conjunction with the accompanying drawings.

BRIEF DESCRIPTION OF THE DRAWINGS

The inventive subject matter may best be understood by reference to the following description taken in conjunction with the accompanying drawings in which.

DETAILED DESCRIPTION

The following description is presented to enable any person skilled in the art to make and use what has been invented, and is provided in the context of particular applications and their requirements. Various modifications to the exemplary embodiments will be readily apparent to those skilled in the art, and the generic principles defined herein may be applied to other embodiments and applications without departing from the spirit and scope of what has been invented. Thus, the inventive subject matter is not intended to be limited to the embodiments shown, but is to be accorded the widest scope consistent with the principles and features disclosed herein.

Methods, computer program products, and systems to predict the routability of a second IC design without compiling the second IC design are provided. A routability metric for the second IC design is calculated from the compilation targeting a first IC design in an EDA computing device. The ability to predict whether the second IC design can be routed shortens the IC device development cycle as resource-intensive compilation processes do not have to be performed to determine routability for second IC target designs that are unlikely to be successful.

An IC device may comprise any number of core blocks, an interconnect routing architecture, and programmable elements that may be programmed to selectively interconnect the core blocks to one another and to define the functions of the core blocks. A core block is located in the routing area and performs the logic or other functions of the IC device. The core area of an IC device may be repeated in a rectangular array of core arrays, or included with other devices in a system-on-a-chip (SOC). The core area may include an array of logic modules and input/output (I/O) modules. The core area may also include other components such as read-only memory (ROM) modules. Horizontal and vertical routing tracks provide interconnections between the various components within a core area. Horizontal and vertical routing tracks also provide interconnections between the various core arrays in an IC device.

Figure 1:
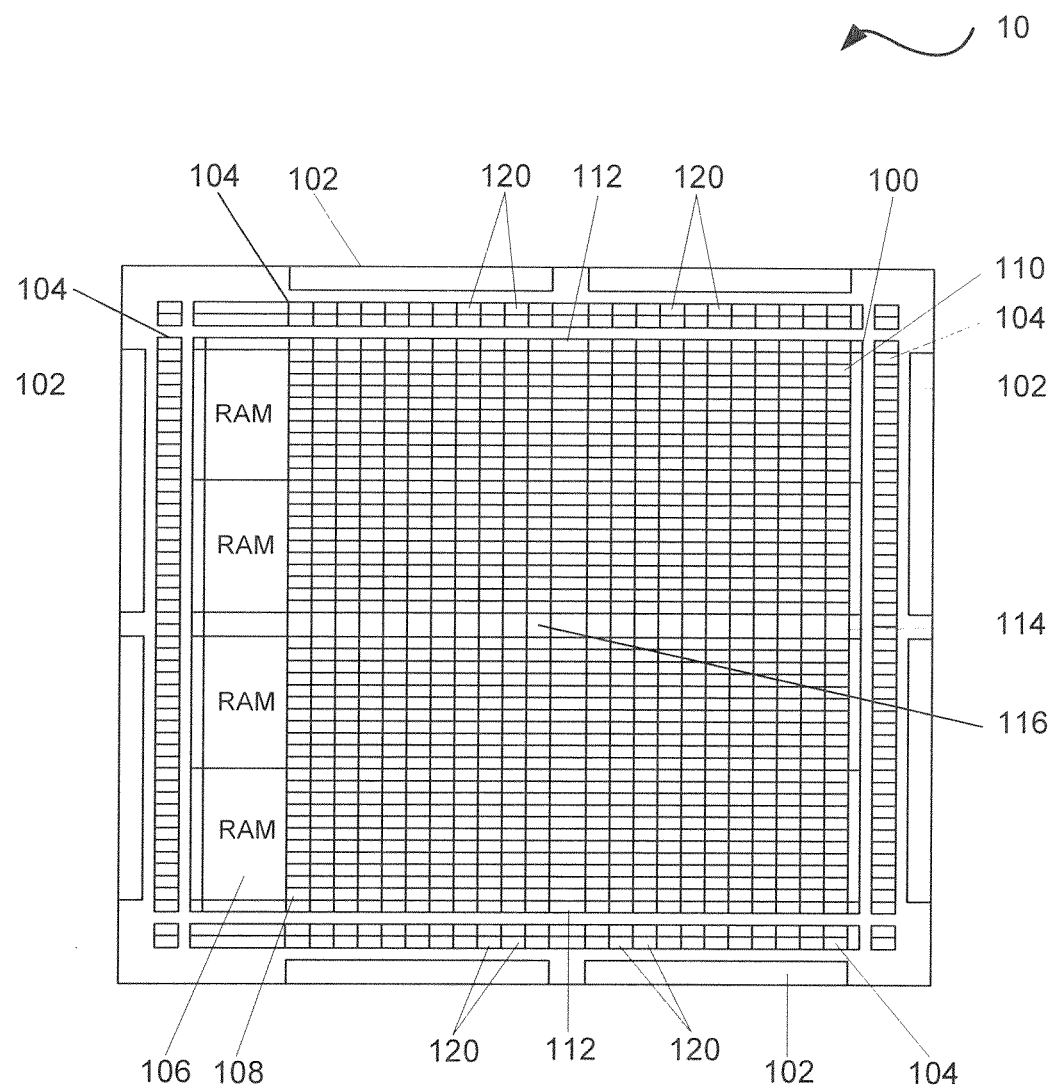
FIG. 1 is a simplified block diagram of an IC device having a core block incorporating the routing architecture (not shown), as described herein.

FIG. 1 is a simplified block diagram of an IC device 10 having a core area 100 incorporating the routing architecture (not shown), as described herein. As shown in FIG. 1, core area 100 is coextensive with a single core array, and comprises core block arrangements such as an array of logic clusters 110, a column of routed clock clusters 112, a row of hard-wired clock clusters 114, a clock tile cluster 116, a row of RAM clusters 108, and RAM memory 106. Core area 100 is surrounded by two rows of I/O clusters 104 and I/O banks 102. In FIG. 1, the edges of the device shown are referred to in terms of compass directions, for example, the top edge is designated the "north" side of the device. On the north and south edges surrounding core area 100, there are eight phase-locked-loops clusters (PLL clusters) 120 intervening in rows of I/O clusters 104.

Figure 2:
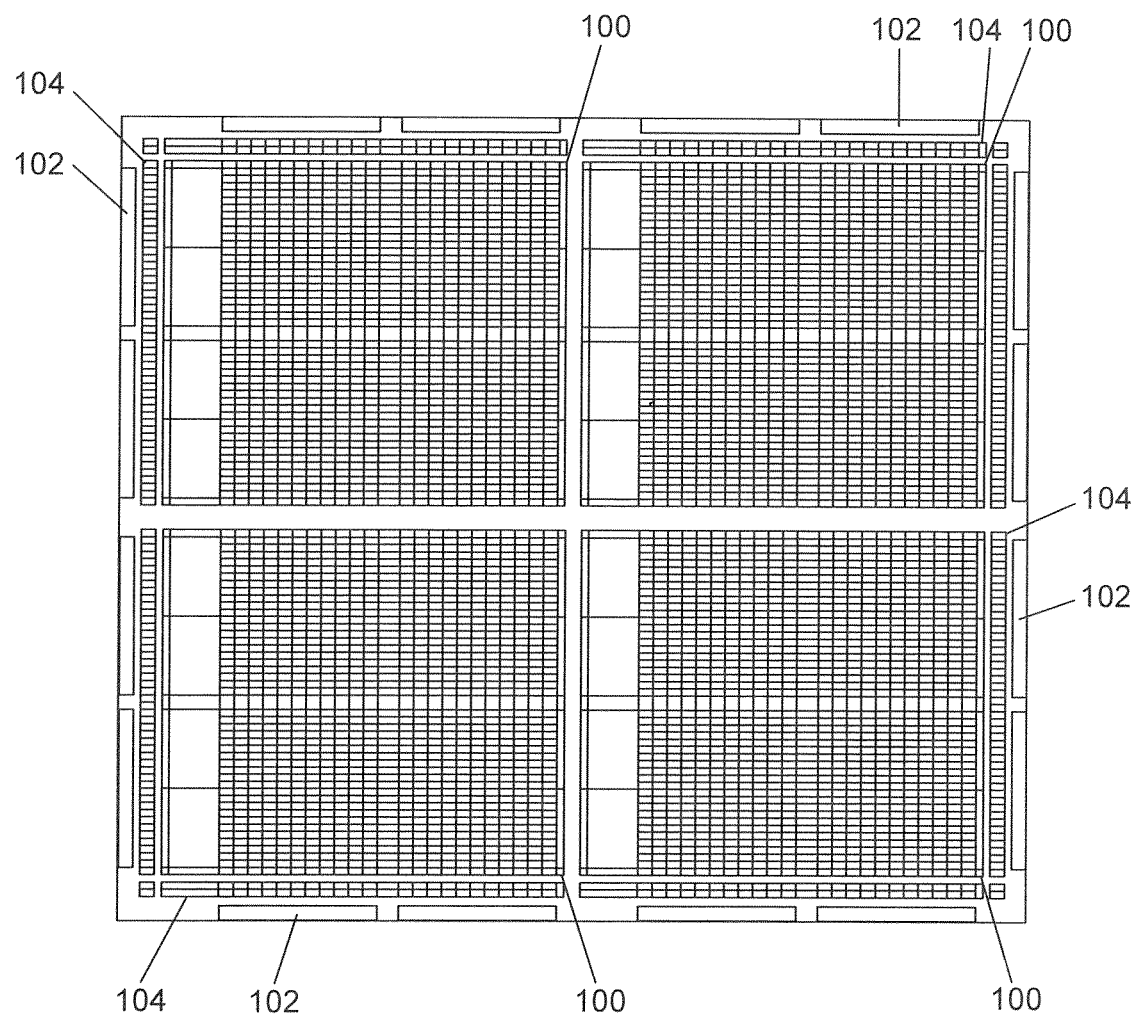
FIG. 2 is a block diagram of an illustrative IC device including multiple core blocks as shown as an example in FIG. 1.

FIG. 2 is a block diagram of an illustrative IC device including multiple core arrays 100 as shown as an example in FIG. 1. As shown in FIG. 2, the IC device core area comprises four core arrays 100, though other numbers, compositions, and arrangements of core arrays are possible. Core arrays 100 are surrounded by I/O clusters 104 and I/O banks 102. The four core arrays are interconnected through a routing architecture with routing tracks running the distance of the IC device, both vertically and horizontally.

In one embodiment, the routability of a second IC design is predicted using a routability metric calculated using results from the compilation targeting a first IC design. Routability generally refers to the ability of the core blocks on a routing layer of an IC device to be routed to effect the desired functional circuit design (i.e., the user circuit/design). Routability represents the ability of all circuit elements in an IC design to be connected to perform the required logic functions by using the available routing resources or routing tracks available in one or more layers of the IC device. Viewed from the perspective of a core block, routability refers to the connectivity of the circuit elements in the core block. Viewed from the perspective of an IC device, routability refers to the connectivity between the core blocks in the IC device.

Figure 3A:
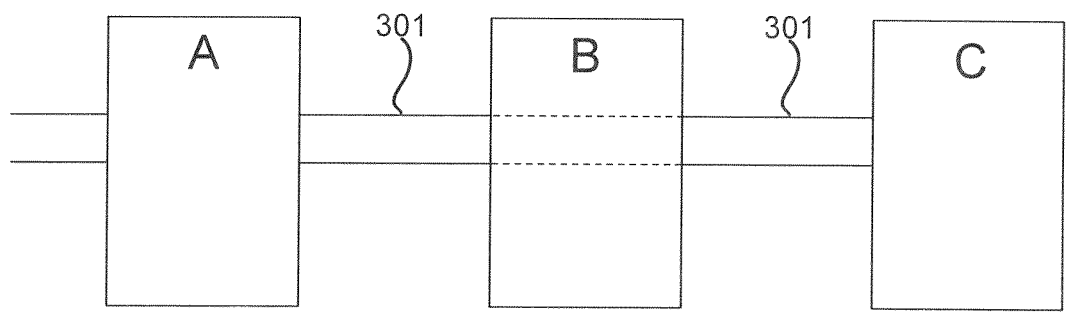
FIG. 3A shows the shortest routing path from core block A to core block C.
Figure 3B:
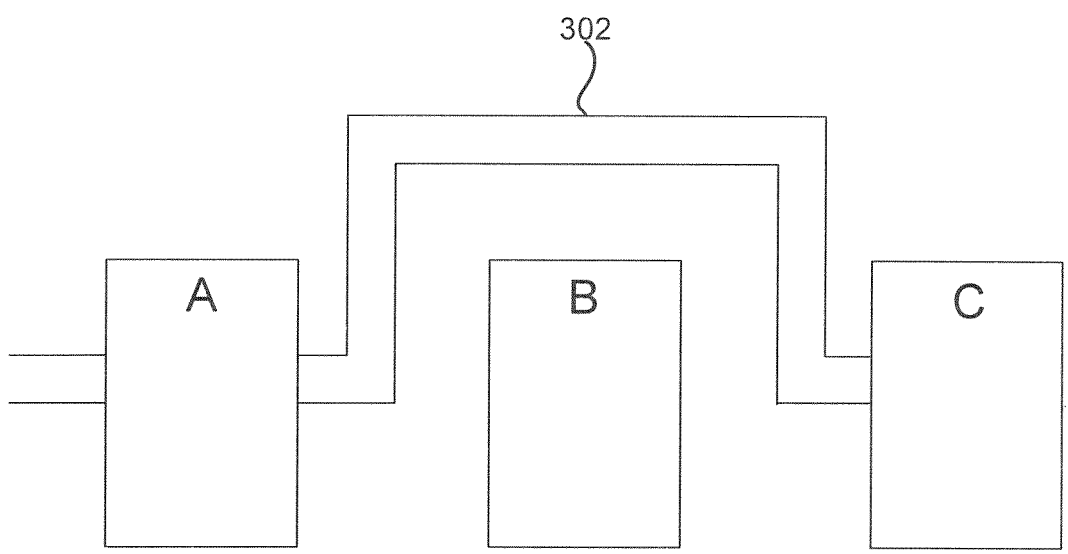
FIG. 3B shows an alternative routing path that bypasses core block B.

In an IC device layer, the routing paths between core blocks commonly follow a specific routing track direction, either horizontal or vertical. FIG. 3A shows the shortest routing path 301 from core block A to core block C. Routing path 301 goes through core block B and is the shortest routing path from core block A to core block C. However, if the routing track space within the area of core block B has all been designated for other uses, then the routing path between core block A and core block C would have to bypass core block B and use an alternative route. FIG. 3B shows an alternative routing path 302 that bypasses the area of core block B. Nonetheless, routing path 302 uses more routing track resources (and likely multiple layers as compared to routing path 301.

The routability metric can be calculated during or after the compilation to the first IC design, but beneficially before the compilation of the second IC design. With the prediction of the routability metric from the compilation of the first IC design, the second IC design does not have to be targeted by a full compile for its routability to be reasonably known.

In one embodiment, the routability metric of the second IC design depends on the routing demand or requirements of the user design. Additionally, the routability also depends on the routing supply or availability of the second IC design. A routability metric is calculated based on a relationship between the routing demand and routing supply for all routing layers in the second IC design.

In one embodiment, the routing demand of a routing layer in the second IC design represents the amount of average interconnects that is required for user design routing purposes in the routing layer. After compiling to the first IC design, the amount of average interconnects in a routing layer of the first IC design is calculated and scaled to obtain the amount of average interconnects in a corresponding routing layer of the second IC design using a track metric. The scaling is done using a track metric for the particular routing layer.

The amount of average interconnects represents the percentage of used routing tracks in the core area of the second IC design predicted from compilation to the first IC design. In some EDA systems, information akin to the value of average interconnects may be reported for subdivisions of the core area of the targeted chip, for example, by quadrant. In one embodiment, information for the subdivisions is combined, for example, by summing, or averaging, etc., to arrive at an average interconnect value for the greater core area.

In one embodiment, the track metric is calculated as the ratio of the length of tracks available for routing in a routing layer of the first IC design compared to the length of tracks available for routing in a corresponding routing layer in the second IC design. Routing tracks are typically located in a specific area known as the routing area in the routing layer. Often, due to different routing areas and device sizes, the length of tracks available for routing differs from one IC design to another. The length of tracks available for routing generally refers to the average interconnects that are available for routing in the core area. The difference in length is taken into consideration by using the track metric in calculating the routing demand of the second IC design. For example, if the first IC device is bigger in size compared to the second IC device, then the second IC design generally has less routing area compared to the first IC design. One track metric for a routing layer can be calculated using the following formula:

> Track metric for a routing layer in second IC design=Length of available routing tracks in a routing layer of first IC design/Length of available routing tracks in the corresponding routing layer of second IC design In one embodiment, the routing demand of a routing layer in the second IC design is calculated using the following formula:

> Routing demand of a routing layer=Amount of average interconnects in a routing layer of first IC design/Track metric for corresponding routing layer In one embodiment, the routing supply of a routing layer in the second IC design represents the available routing area in the routing layer. A routing layer typically has a routing area, which includes areas of different core blocks that perform different functions in the IC device. For example, the routing area in a routing layer can have different types of core blocks such as digital signal processing (DSP) blocks, HCell blocks, medium embedded memory block (MEAB), and magnetoresistive random-access memory (MRAM) blocks. Routability refers to the ability to route the core blocks in the routing area and is therefore dependent on the routing area or routing tracks still available for use. Often, significant routing track area is rendered unavailable in core block circuitry areas. Core routing blockage is said to have occurred.

In one embodiment, the total routing area is the area allocated for routing including the routing blockage. The total routing area is dependent on the size of the IC device—the bigger a device is, the larger total routing area it has. The available routing area is the area that can actually be used for routing without any core blockage. The available routing area is dependent on the core routing blockage caused by the core blocks of a routing layer and also on the number of core blocks used. Core blocks that cause more core routing blockage and a high number of core block usage contribute to more total routing blockage, which in turn reduces routability among the core blocks in the routing area.

In one embodiment, the total routing blockage caused by all core blocks in a routing layer of the second IC design is calculated. As different core blocks cause different amounts of core routing blockage, a normalized routing blockage amount, N, for all core blocks is first calculated. The normalized routing blockage for a core block is dependent on the size of the core block, the size of the core area, and the layer routing blockage. The layer routing blockage is pre-defined for a specific layer on an IC device and may be based, at least in part, on the size of the IC device. The layer routing blockage can be readily pre-defined because its greater dependence is on the hardware circuitry design and its consumption of area on the metal/routing layer, rather than on the user circuit to be implemented.

The following formula is used in calculating the normalized routing blockage for a particular core block type:

> Normalized routing blockage (N)=(Size of a core block/Size of core area)×Layer routing blockage in a routing layer There may be a number of core blocks of the same type in a routing layer. The core routing blockage amount, B, caused by a particular type of core block in the routing layer is calculated using the following formula:

> Core routing blockage caused by a core block type (B)=N×number of blocks of the particular core block type The total routing blockage, T, caused by all core block types in the routing layer is calculated by combining the core routing blockage amounts caused by every core block type using the following formula:

> Total routing blockage, $T=\Sigma Bn$ where Bn=core routing blockage amount caused by a core block type In one embodiment, the routing supply or available routing area in a routing layer is dependent on the total routing blockage and the total routing area. To determine the routing supply, the total routing blockage is excluded from the total routing area. calculated with the following formula:

> Routing supply of a routing layer=$(1-T)/[(W+S)/W]$ where W=width of a routing track on a routing layer in second IC device S=width of space between routing tracks In one embodiment, the routability metric of an IC design is calculated as the ratio of routing demand over routing supply for all routing layers in the design.

> Routability metric (R)=routing demand/routing supply (for all routing layers in IC design)

In one embodiment, the routability metric is used to determine the degree of routing difficulty for targeting the second IC design. The degree of routing difficulty reflects how easy or difficult it is to route the second IC design. In other words, the degree of routing difficulty reflects the amount of time and computing resources that need to be expended to route the blocks to successfully implement a user circuit design. Some IC devices are more difficult to route than others due to certain factors such as routing architecture, high resource usage, and design requirements. To associate a routability metric with a degree of routing difficulty, the spectrum of possible values for the routability metric is divided into several discrete ranges. Every range is then assigned a different degree of difficulty. For example, a design with a routability metric that falls below 0.8 is assigned as "easy" to route, a routability metric between 0.8 and 1.4 is assigned as "medium", and a routability metric above 1.4 is assigned as "difficult". While three degrees of difficulty are used, one skilled in the art will appreciate that the degrees of difficulty and their associated range of values are not meant to be limiting as they are provided for exemplary purposes. Thus, besides the exemplary degrees of difficulty, different degrees of difficulty may be used in other embodiments. In addition, other embodiments may also associate different a different range of values with each degree of difficulty. In one embodiment, two discrete ranges effectively result from choosing a single routability metric threshold value. Routability metric values below the threshold signal likely solutions, while values above the threshold signal unlikely success.

According to one embodiment, the routability metric or degree of routing difficulty can be used as an indicator whether to compile the second IC design. A user can decide on the routability metric or degree of difficulty that is acceptable before compiling the second IC design. For example, the user can compile the second IC design when the routability metric for the design is below 0.8 or falls within the "easy" range. Also, the FDA computing device can be configured to automatically perform compilation to the second IC design for specific values of the routability metric or when the routability metric falls within a specified range. For example, the second IC design can be automatically targeted by a compile when the routability metric falls within the "easy" or "medium" range.

Figure 4:
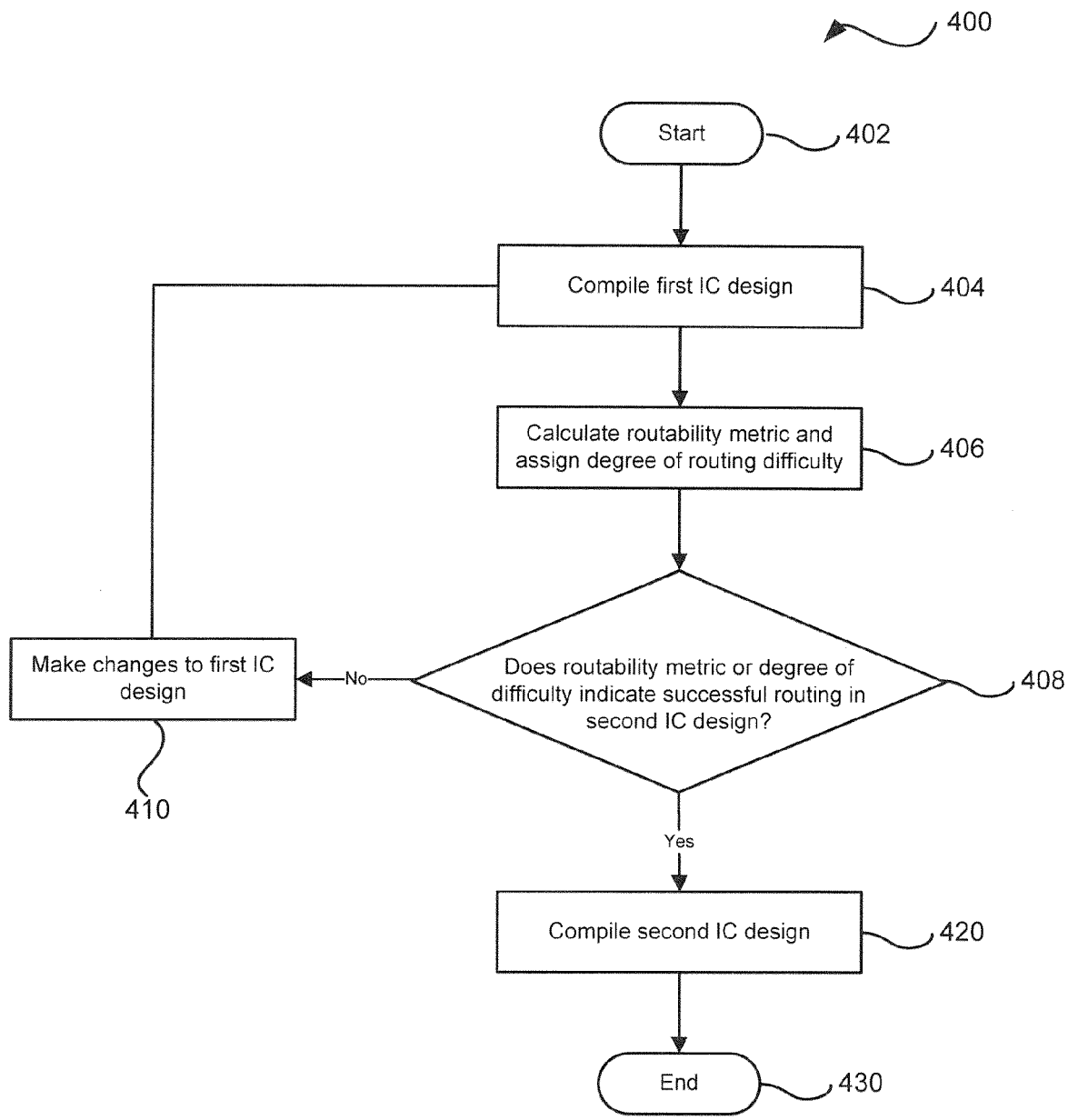
FIG. 4 shows a process flow where a routability metric can be used to predict the routability of a second IC design without having to compile the first IC design, according to one embodiment.

FIG. 4 shows a process flow where a routability metric can be used to predict the routability of a second IC design without having to compile to the second IC design, according to one embodiment. The process flow 400 begins with operation 402 and proceeds to compile operation 404 where the first IC design is targeted in an FDA computing device. In operation 406, the routability metric for the second IC design is calculated using results from the compilation to the first IC design. Also in operation 406, the calculated routability metric is assigned a degree of routing difficulty. In operation 408, the routability metric or degree of routing difficulty is used to decide whether the second IC design can be routed with sufficient likelihood. For example, a routability metric that is assigned as "easy" to route means that the second IC design can likely be routed successfully. Conversely, a routability metric that is assigned as "difficult" to route means that the second IC design cannot likely be routed reasonably, if at all. In other words, much time and computing resources are probably needed to route the design successfully. If the routability metric or degree of routing difficulty does not sufficiently indicate successful routing to the second IC design, then changes can be made to the user circuit design targeted to the first IC design in operation 410. (Other changes that may impact the routing results of a compile to the first IC design, such as compiler options, may be made in addition to, or in lieu of changes to the user circuit design.) The modified first IC design is subsequently compiled again in operation 404. The loop of operations from 404 to 408 is repeated until the desired routability metric is obtained. In operation 408, if the routability metric or degree of routability indicates successful routing in the second IC design, the second IC design is targeted in compile operation 420. The process flow ends after that in operation 430.

The process described in relation to FIG. 4 serves to find a solution that can be successfully implemented on a particular second IC design, i.e., a particular device type. As one alternative, preservation of the user circuit design can be treated as a higher priority. For example, the processing of block 410 as previously described could be replaced with the selection of an alternate second IC design, i.e., a different device type. From there, processing could proceed to block 408, rather than to block 404, as shown. One of skill appreciates the opportunities made possible by inventive subject matter to adapt specific processing to specific needs and priorities.

Figure 5:
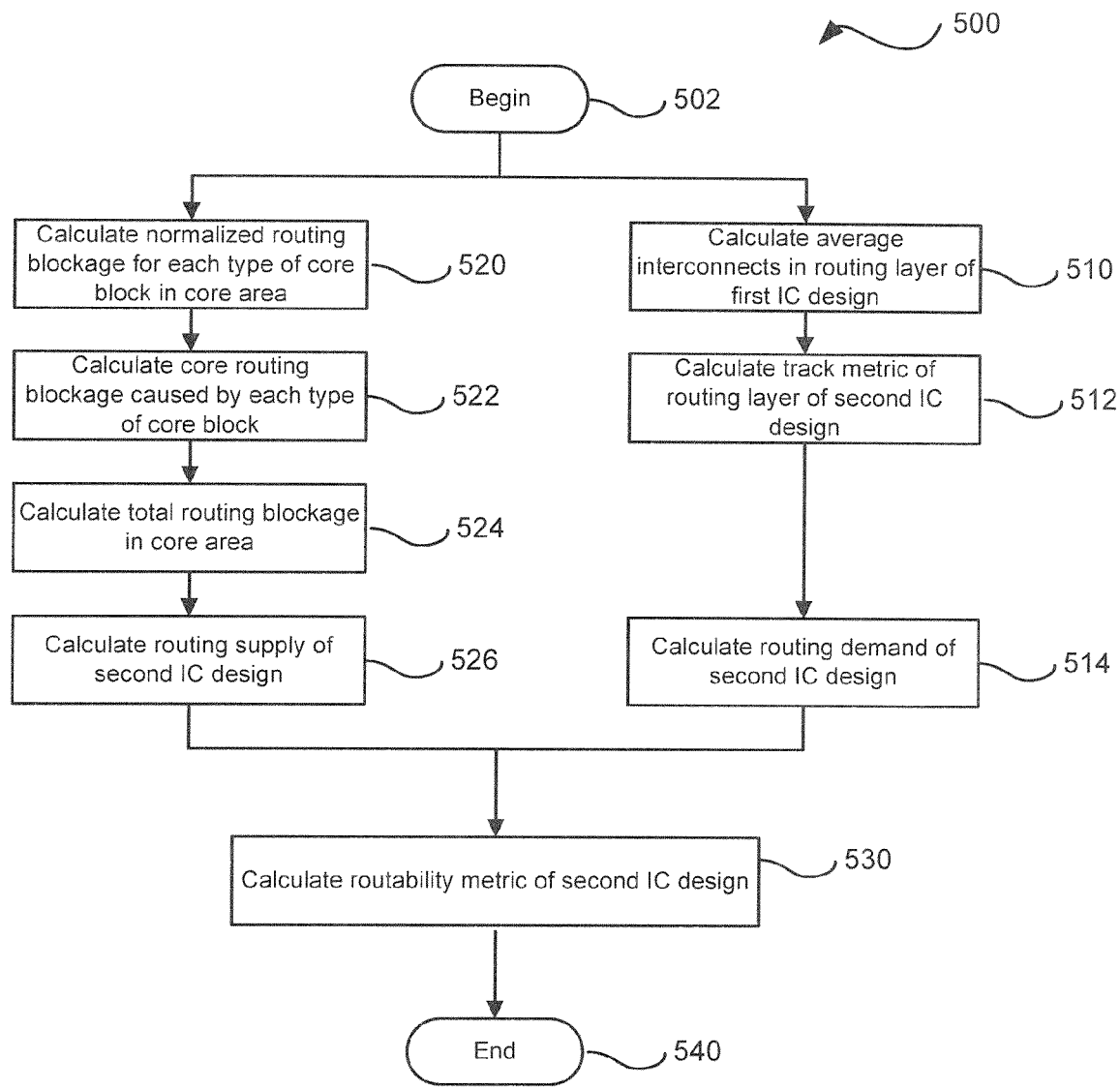
FIG. 5 shows a process flow to calculate the routability metric of a second IC design using the compilation results of a first IC design.

FIG. 5 shows a process flow to calculate the routability metric of a second IC design using the compilation results of a first IC design. Process flow 500 begins with operation 502 and proceeds to operation 510 where the amount of average interconnects in a routing layer of the first IC design is calculated. In one embodiment, the number of interconnects is obtained from the compilation of the first IC design. In operation 512, the track metric for a routing layer in the second IC design is calculated. In one embodiment, the track metric is calculated as the ratio of the length of available routing tracks in a routing layer of the first IC design over the length of available routing tracks in the corresponding routing layer of the second IC design. Operation 514 then calculates the routing demand of the second IC design. According to one embodiment, the routing demand is calculated as the amount of average interconnects of the first IC design scaled to the amount of average interconnects of the second IC design. The scaling is done using the track metric of the respective routing layer.

Operations 520 to 526 calculate the routing supply of the second IC design. The calculation begins with operation 520 where the normalized routing blockage for each type of block in a routing layer of the second IC design is obtained. According to one embodiment, the normalized routing blockage is dependent on the size of the core block type, the size of the core area, and the amount of layer routing blockage in the routing layer. After that the flow proceeds to operation 522 where the core routing blockage caused by each type of core block is calculated. In one embodiment, the core routing blockage is dependent on the normalized routing blockage and number of each core type that is used in the second IC design. Operation 524 calculates the total routing blockage in a routing layer. In one embodiment, the total routing blockage is the combination of the core routing blockage caused by all core block types in the routing layer. In operation 526, the routing supply of the second IC design is calculated. In one embodiment, the routing supply is calculated by deducting the total routing blockage from the total available routing area for the second IC design.

According to one embodiment, operations 510 to 514 and operations 520 to 526 can be performed simultaneously. After the routing demand and routing supply of the second IC design are calculated, the flow proceeds to operation 580 to calculate the routability metric of the second IC design. In one embodiment, the routability metric is calculated as the ratio of routing demand over routing supply of the second IC design. In another embodiment, the calculated routability metric is also mapped to a degree of routing difficulty. Both the routability metric and degree of routing difficulty can be used to signal the routability of the second IC design. For example, a routability metric that is below 0.8 or assigned as "easy" to route means that the second IC design can very likely be routed successfully. The process flow ends at operation 540.

According to one embodiment, the routability metric of the second IC design can be calculated during or after the place-and-route step completes in the compilation to the first IC design. Generally, the place-and-route step performs two main functions—to determine physical locations for circuitry functions in the IC device and to route the interconnections between the placed circuit functions.

In one embodiment, the routability of a structured ASIC design can be predicted by calculating its routability metric from the compilation of an FPGA design. It is often desirable to convert to a structured ASIC device from an FPGA device due to the low costs and shorter development cycle involved in designing an FGPA device. By designing the functionalities of a structured ASIC device on an FPGA prototype, the NRE costs and development time needed for designing prototype masks can be bypassed. When the design requirements are finalized in the FPGA prototype, the user design can then be targeted to a structured ASIC implementation.

To move from an FPGA design to a structured ASIC design, the structured ASIC design requires a separate compilation after compiling to the FPGA design. The separate compilation will ensure that the structured ASIC design is able to support the resources used in the FPGA design. If the compilation for the structured ASIC design is unsuccessful, then the user design is modified and compiled to the FPGA again and verified, leading to several iterations of compilation for both the structured ASIC and FPGA designs, until a compatible structured ASIC design can be found.

Because of the possible different routing architectures in FGPA and structured ASIC devices, an FPGA design that is routable for the user design might not map to a structured ASIC design that is routable as well. An FPGA device uses one or more pre-designed routing layers where the number of routing tracks is pre-defined for all users of the device. However, a structured ASIC device may readily use routing layers that can be customized with the necessary routing information depending on each user's design requirements. Differences like this illustrate why successful compilation to an FPGA, even a comparable one, generally cannot, by itself, predict successful compilation of the same user design to a structured ASIC.

It is therefore desirable predict the routability of a structured ASIC design before initiating a resource-intensive compile. If the routability metric indicates that the structured ASIC design is not routable, then the user design can be modified (or other compiler inputs can be changed, such as compiler option settings) and compiled to an FPGA again for verification until a suitable routability metric is obtained. The use of a routability metric shortens the development cycle of the FPGA-to-structured-ASIC conversion by reducing or eliminating the number of structured ASIC design compilations.

In one embodiment, the routing demand or the amount of average interconnects that is generated during the compilation of the FPGA design is used to calculate the routing demand of the structured ASIC design. The routing demand of the FPGA design cannot be directly used as the routing demand of the structured ASIC design because of differences in routing architecture between both devices. Also, different structured ASIC designs also have different available routing areas because of differences in device size, Thus, together with the routing demand of the FPGA, a track metric for the structured ASIC is used as a scale factor to calculate the routing demand of the structured ASIC.

In one embodiment, the track metric is calculated as a ratio of the length of routing tracks in a routing layer of the FPGA design over the length of routing tracks in a corresponding routing layer of the structured ASIC device. For example, during the conversion of an FPGA design to a structured ASIC design, the routing information on a routing layer with horizontal tracks in an FPGA device will be converted to routing information on the programmable metal layer M5 in a structured ASIC device. The routing information on a layer with vertical tracks in an FPGA device will be converted to routing information on the programmable metal layer M6 in a structured ASIC device. Therefore, the track metrics for the M5 and M6 layers are calculated as follows:

Track metric for $M5$ layer=Length of horizontal tracks in FGPA design/Length of tracks in $M5$ layer in structured ASIC design Track metric for $M6$ layer=Length of vertical tracks in FGPA design/Length of tracks in $M6$ layer in structured ASIC design In one embodiment, the conversion of an FPGA design to different structured ASIC designs uses different track metrics due to differences in device size. For example, the conversion of an FPGA design to the design of a smaller structured ASIC device uses a larger track metric compared to the conversion of the same FPGA design to the design a bigger structured ASIC device. The larger the track metric, the less area is available for routing in the structured ASIC design. The following table shows some exemplary track metrics for the design conversion of the Stratix® II FGPA devices to the HardCopy® II structured ASIC devices. Both the Stratix II devices and HardCopy II devices are products from Altera Corporation in San Jose, Calif.

| FPGA Device (Stratix II) | Structured ASIC Device (HardCopy II) | M5 Track Metric | M6 Track Metric |
|---|---|---|---|
| 2S30 | HC210 | 0.95 | 1.71 |
| 2S60 | HC210 | 1.39 | 2.14 |
|  | HC220 | 0.91 | 1.51 |
| 2S90 | HC210 | 1.85 | 2.49 |
|  | HC220 | 1.22 | 1.75 |
|  | HC230 | 0.89 | 1.34 |
| 2S130 | HC220 | 1.55 | 1.96 |
|  | HC230 | 1.12 | 1.50 |
| 2S180 | HC230 | 1.22 | 1.84 |
|  | HC240 | 1.00 | 1.46 |

According to one embodiment, the routing demand of the M5 and M6 layers in a structured ASIC design can be calculated as follows, respectively:

Routing demand of $M5$ layer=Amount of average interconnects in FPGA layer corresponding to $M5$ layer/Track metric for $M5$ layer Routing demand of $M6$ layer=Amount of average interconnects in FPGA layer corresponding to $M6$ layer/Track metric for layer According to one embodiment, the routing supply of the structured ASIC design is the available routing area on the design excluding the total routing blockage in the area. The routing supply is die-size dependent where bigger devices have more routing area compared to smaller devices. The total routing blockage depends on the resource usage of core blocks in the routing area. A high resource usage increases routing blockage in the core area and thus, reduces the area that can be used for routing. The core area of a HardCopy II structured ASIC design has the HCell, DSP, MEAB, and MRAM blocks. These different types of blocks contribute to different amounts of core routing blockage. In one embodiment, core blockage is determined without reference to all block types occurring in the core area. For example, core block types with negligible use of metal layers for intra-block connections may be omitted from the routing blockage determination (or may have their routing blockage effect included in a more general factor in the routability determination).

According to one embodiment, the normalized routing blockage for each type of core block determines the routing efficiency of the block. A high normalized routing blockage for a core block means that the core block causes more routing blockage in the core area, which in turn decreases the overall routability of the routing layer. The normalized routing blockage, N, for each core block can be calculated as follows:

> Normalized routing blockage ($N$) for $M5$ layer=(Size of a core block/Size of core area)×layer routing blockage in $M5$ layer
>
> Normalized routing blockage ($N$) for $M6$ layer=(Size of a core block/Size of core area)×Layer routing blockage in $M6$ layer The layer routing blockages for the M5 and M6 routing layers are pre-defined values based on the routing architecture of the structured ASIC.

According to one embodiment, the normalized routing blockage for each core block can be used to calculate the core routing blockage caused by a core block type in the structured ASIC design. The core routing blockage, B, for each core block type is calculated as follows:

> Core routing blockage caused by core block type ($B$)=$N$×number of blocks of the particular core block type According to one embodiment, the total blockage in the routing area of the structured ASIC design depends on the type of core blocks and the number of core blocks that are used. For example, the total blockage, T, for a structured ASIC design that factors the HCell, DSP, MEAB, and MRAM blocks is calculated as follows:

> Total routing blockage ($T$)=$\Sigma(B_{Hcell}+B_{DSP}+B_{MRAM}+B_{MEAB})$

According to one embodiment, the routing supply or available routing area of the structured ASIC design is dependent on the total blockage and the size of the routing area. The routing supply can be calculated as follows:

> Routing supply of structured ASIC design=$(1-T)/[(W+S)/W]$ where W=width of a routing track in a routing layer of a structured ASIC device
S=width of space between two routing tracks According to one embodiment, the routability metric of the structured ASIC design is calculated as the ratio of routing demand over routing supply of the structured ASIC design. The routability metric, R, can be calculated as follows:

> Routability Metric ($R$)=(Routing demand of $M5$ layer/Routing supply of $M5$ layer)+(Routing demand of $M6$ layer/Routing supply of $M6$ layer)

Figure 6:
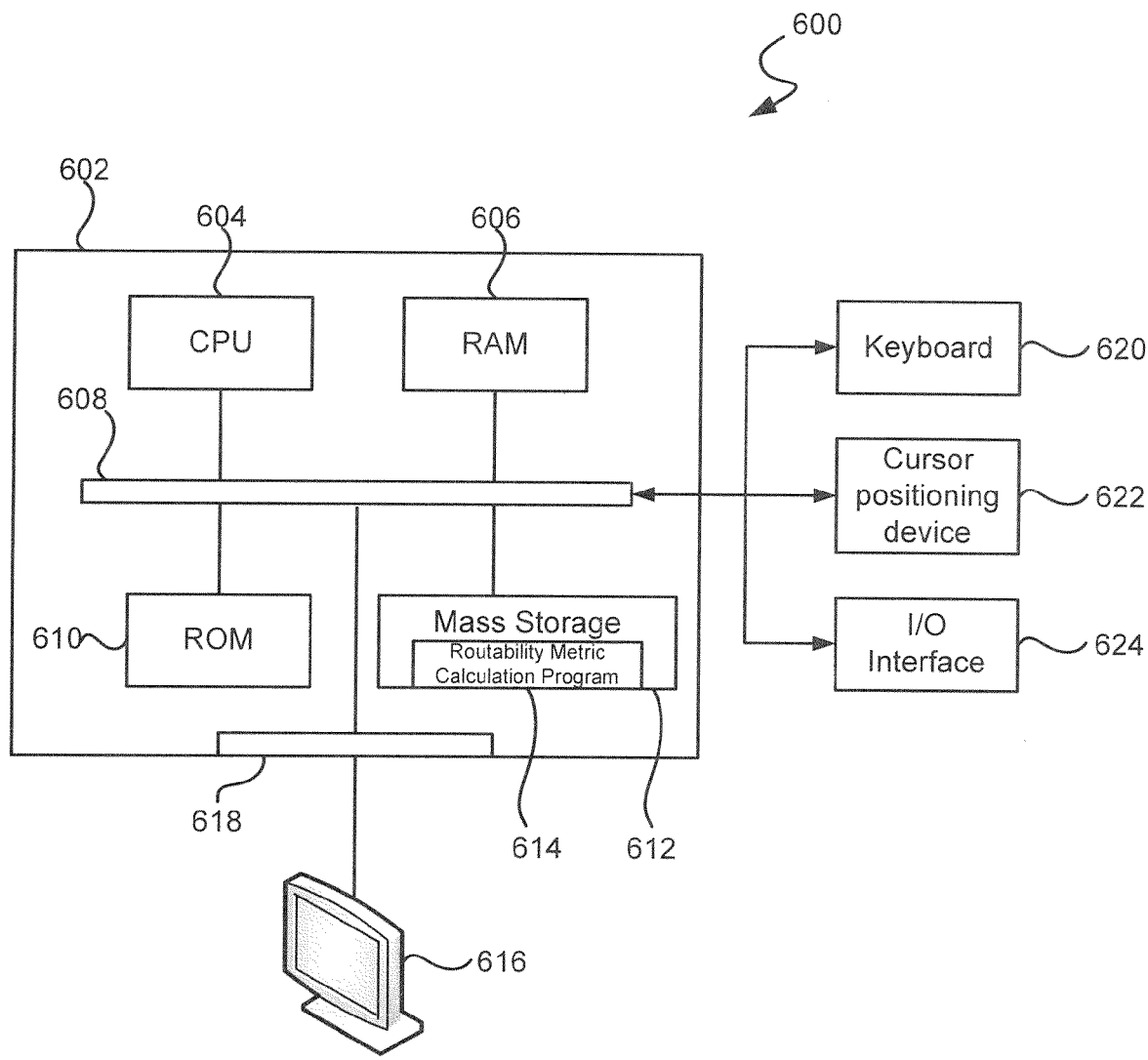
FIG. 6 is a simplified schematic diagram of a computer system for implementing embodiments of the inventive subject matter.

FIG. 6 is a simplified schematic diagram of a computer system 600 for implementing embodiments of the inventive subject matter. It should be appreciated that the methods described herein may be performed with a digital processing system, such as a conventional, general-purpose computer system with software, and possibly specialized hardware, included to implement EDA functional processing. Special-purpose computers, which are designed or programmed to perform only one function may be used in the alternative. The computer system of FIG. 6 may be used for calculating the routability metric of a second IC design after compiling a first IC design. The computer system includes a central processing unit (CPU) 604, which is coupled through bus 608 to random access memory (RAM) 606, read-only memory (ROM) 610, and mass storage 612.

Mass storage device 612 represents a persistent data storage device such as a floppy disc drive or a fixed disc drive, which may be local or remote. Routability metric calculation program 614 resides in mass storage 612, but can also reside in RAM 606 during processing. It should be appreciated that CPU 604 may be embodied in a general-purpose processor, a special-purpose processor, or a specially programmed logic device.

Display device 616 is in communication with CPU 604, RAM 606, ROM 610, and mass storage device 612, through bus 608 and display interface 618. Display device 616 is configured to display the user interface and graphical representations described herein. For example, according to one embodiment, display 616 shows the routability metric or degree or routing difficulty associated with the second IC design.

Keyboard 620, cursor positioning device 622, and input/output (I/O) interface 624 are coupled to bus 608 to communicate information in command selections to CPU 604. Keyboard 620 and cursor positioning device 622 are examples of input devices used to enter coordinates on the display screen and commands to the CPU 604. Examples of a cursor positioning device include a mouse, trackball, joystick, graphic tablet. According to one embodiment, user input on routability metric calculation can be received as a command selected with a mouse from a selection-driven menu on I/O interface 624. It should be appreciated that data to and from external devices may be communicated through I/O interface 624.

Embodiments that include inventive aspects may be practiced with various computer system configurations including hand-held devices, microprocessor systems, microprocessor-based or programmable consumer electronics, minicomputers, mainframe computers, and the like. Inventive aspects can also be practiced in distributed computing environments where tasks are performed by remote processing devices that are linked through wire-based or wireless network, for example.

With the above embodiments in mind, it should be understood that the inventive subject matter can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

The method, computer program and system, for calculating routability metric described herein may be incorporated into any suitable integrated circuit (IC). For example, the method, computer program, and system may be incorporated into other types of programmable logic devices (PLDs) such as programmable array logic (PAL), programmable logic array (PLA), field programmable logic array (FPLA), electrically programmable logic devices (EPLD), electrically erasable programmable logic device (EEPLD), logic cell array (LCA), just to name a few.

Such a PLD described herein may be part of a data processing system that includes one or more of the following components: a processor, memory, I/O circuitry, and peripheral devices. In one embodiment, the programmable logic device may be one of the PLDs commercialized by Altera Corporation. Certain inventive subject matter disclosed herein can also be embodied as computer readable code on a computer readable medium. The computer readable medium is any data storage device that can store data, which can thereafter be read by a computer system. Examples of the computer readable medium include hard drives, network attached storage (NAS), read-only, memory, random-access memory, compact disc read-only memory (CD-ROM), compact disc recordable (CD-R), compact disc rewritable (CD-RW), magnetic tapes, and other optical and non-optical data storage devices. The computer readable medium can also be distributed over a network-coupled computer system on that the computer readable code is stored and executed in a distributed fashion.

An example of EDA software that may be useful in the practice of certain inventive subject matter herein is the Quartus® II software, which is commercially available from Altera Corporation, San Jose, Calif. It should be understood that the other commercially available or custom developed EDA software could be similarly useful. It is also to be understood that EDA software can often be installed on any variety of computing device or system, including one such as the illustrative computer system 600 described herein.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

While inventive subject matter disclosed herein has been particularly described with respect to the illustrated embodiments, it will be appreciated that various alterations, modifications and adaptations may be made based on the present disclosure, and are intended to be within the scope of what has been invented. While the inventive subject matter has been described in connection with what are presently considered to be the most practical and preferred embodiments, it is to be understood that the disclosed embodiments and related detail are not intended to limit or circumscribe the scope of what has been invented, which is rather set forth in claims that follow.

What is claimed is:

1. A method for predicting routability of a second integrated circuit (IC) design, the method comprising:
    calculating a routability metric for a second IC design based on input from compiling a first IC design using an electronic design automation (EDA) computing apparatus, wherein the first IC design and the second IC design are, respectively, for a first IC device and a second IC device, the first and second IC devices being different with respect to device type wherein a routing architecture of a first device type is different than a routing architecture of a second device type.

2. The method of claim 1, wherein the input comprises:
    an average interconnects value associated with the first IC design;
    an available routing area value associated with the second IC design; and
    a total routing blockage value associated with the second IC design.

3. The method of claim 1 further comprising associating the routability metric with a degree of routing difficulty.

4. The method of claim 1, further comprising determining whether to compile to the second IC design based at least in part on the routability metric.

5. The method of claim 1, wherein the calculating comprises:
    calculating a routing demand for the second IC design based at least in part on an amount of average interconnects required in a routing layer of the second IC design;
    calculating a routing supply for the second IC design based at least in part on an available routing area in the routing layer of the second IC design; and
    calculating a relationship between the routing demand and the routing supply.

6. The method of claim 5, wherein the calculating a routing demand for the second IC design comprises:
    calculating an amount of average interconnects in a routing layer associated with the first IC design;
    calculating a track metric for a routing layer of the second IC design based at least in part on track resources available for routing in a routing layer of the first IC design and track resources available for routing in the routing layer of the second IC design; and
    calculating an average interconnects value associated with the routing layer of the second IC design based at least in part on the track metric.

7. The method of claim 5, wherein the calculating a routing supply for the second IC design comprises:
    calculating a normalized routing blockage for a core block type;
    calculating a core routing blockage associated with the core block type;
    calculating a total routing blockage associated with the routing layer of the second IC design based at least in part on the core routing blockage; and
    calculating a routing supply value associated with the routing layer of the second IC design based at least in part on the total routing blockage and a total routing area associated with the routing layer of the second IC design.

8. The method of claim 1 wherein the first device is a field programmable gate array (FPGA) device and the second device is a structured application-specific integrated circuit (ASIC) device.

9. A computer program embedded in a non-transitory computer-readable storage medium to predict routability of a second integrated circuit (IC) design, the computer program comprising:
    computer code for calculating a routability metric for a second IC design using compilation results of a first IC design, wherein the first IC design and the second IC design are, respectively, for a first IC device and a second IC device, the first and second IC devices being different with respect to device type wherein a routing architecture of a first device type is different than a routing architecture of a second device type.

10. The computer program of claim 9 further comprising:
    computer code for assigning a degree of routing difficulty associated with the second IC design based at least in part on the calculated routability metric.

11. The computer program of claim 9, wherein the computer code for calculating a routability metric for the second IC design 1 comprises:
    computer code for calculating an average interconnects requirement in a routing layer of the second IC design;
    computer code for calculating an available routing area in the routing layer of the second IC design; and computer code for calculating a routability metric based at least in part on a relationship between the average interconnect requirement and the available routing area.

12. The computer program of claim 11, wherein the computer code for calculating an amount of average interconnects comprises:
   computer code for ascertaining an amount of average interconnects associated with a compile operation targeting the first IC design; and
   computer code for calculating a track metric associated with the second IC design; and
   computer code for scaling the amount of average interconnects associated with a compile operation targeting the first IC design with the track metric to obtain an amount of average interconnects associated with the second IC design.

13. The computer program of claim 12, wherein the computer code for calculating a track metric comprises:
   computer code for ascertaining a length of available routing tracks in a routing layer of the first IC design;
   computer code for ascertaining a length of available routing tracks in the routing layer of the second IC design; and
   computer code for calculating the track metric based at least in part on a relationship between the length of the available routing tracks in the routing layer of the first IC design and the length of the available routing tracks in the routing layer of the second IC design.

14. The computer program of claim 11, wherein the computer code for calculating an available routing area comprises:
   computer code for calculating a normalized routing blockage for each core block type in a core area of the routing layer of the second IC design;
   computer code for calculating a respective core routing blockage for each core block type in the core area;
   computer code for calculating a total routing blockage based at least in part on at least one said core routing blockage and a value associated with a quantity of instances of the associated core block type; and
   computer code for calculating the available routing area based at least in part on said total routing blockage.

15. The computer program embedded in a non-transitory computer-readable storage medium of claim 9 wherein the first device is a field programmable gate array (FPGA) device and the second device is a structured application-specific integrated circuit (ASIC) device.

16. A system to predict routability of a second integrated circuit (IC) design from the compilation of a first IC design, the system comprising:
   a computer device having a central processing unit (CPU);
   an input device coupled to the CPU;
   a memory device coupled to the CPU, the memory device having an electronic design automation (EDA) program, wherein program instructions of the EDA program, when executed by the CPU, cause the CPU to calculate a routability metric associated with a second IC design using results from the compilation of the first IC design, wherein the first IC design and the second IC design are, respectively, for a first IC device and a second IC device, the first and second IC devices being different with respect to device type wherein a routing architecture of a first device type is different than a routing architecture of a second device type; and
   a display device coupled to the CPU whereby an indication associated with said routability metric can be displayed.

17. The system of claim 16, wherein the program instructions to calculate a routability metric further comprise program instructions to assign a degree of routing difficulty to the routability metric.

18. The system of claim 16, wherein the program instructions to calculate a routability metric further comprise:
   program instructions to calculate a routing demand for a routing layer in the second IC design;
   program instructions to calculate a routing supply for the routing layer in the second IC design; and
   program instructions to calculate a relationship between the routing demand and the routing supply for the routing layer in the second IC design.

19. The system of claim 18, wherein the program instructions to calculate a routing demand comprise:
   program instructions to calculate a track metric, wherein the track metric represents a length of tracks available for routing in a routing layer of the first IC design compared to a length of tracks available for routing in the routing layer of the second IC design;
   program instructions to ascertain an amount of average interconnects in the routing layer of the first IC design; and
   program instructions to convert the amount of average interconnects in the routing layer in the first IC design to an amount of average interconnects required in the second IC design based on the track metric.

20. The system of claim 18, wherein the program instructions to calculate a routing supply comprise:
   program instructions to calculate a total routing area in the routing layer of the second IC design;
   program instructions to calculate a total routing blockage for the routing layer in the second IC design; and
   program instructions to exclude the total routing blockage from the total available routing area.

21. The system of claim 20, wherein program instructions to calculate a total routing blockage comprise:
   program instructions to calculate a normalized routing blockage for a core block type in the routing layer of the second IC design;
   program instructions to calculate a core routing blockage for the core block type; and
   program instructions to calculate a total routing blockage for the routing layer of the second IC design by combining the core routing blockages of a plurality of core block types.

22. The system of claim 18, wherein program instructions to calculate a relationship between the routing demand and the routing supply for the routing layer in the second IC design comprise:
   program instructions to calculate the ratio of the routing demand to the routing supply.

23. The system of claim 16 wherein the first device is a field programmable gate array (FPGA) device and the second device is a structured application-specific integrated circuit (ASIC) device.

* * * * *